US011693597B2

(12) United States Patent
Li et al.

(10) Patent No.: US 11,693,597 B2
(45) Date of Patent: Jul. 4, 2023

(54) MANAGING PACKAGE SWITCHING BASED ON SWITCHING PARAMETERS

(71) Applicant: Micron Technology, Inc., Boise, ID (US)

(72) Inventors: Juane Li, Milpitas, CA (US); Jason Duong, San Jose, CA (US); Fangfang Zhu, San Jose, CA (US); Chih-Kuo Kao, Fremont, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 126 days.

(21) Appl. No.: 17/445,481

(22) Filed: Aug. 19, 2021

(65) Prior Publication Data
US 2023/0056808 A1 Feb. 23, 2023

(51) Int. Cl.
*G06F 3/06* (2006.01)
*G11C 13/00* (2006.01)

(52) U.S. Cl.
CPC .......... *G06F 3/0659* (2013.01); *G06F 3/0604* (2013.01); *G06F 3/0673* (2013.01); *G11C 13/004* (2013.01); *G11C 13/0069* (2013.01)

(58) Field of Classification Search
CPC .... G06F 3/0659; G06F 3/0604; G06F 3/0673; G11C 13/004; G11C 13/0069
See application file for complete search history.

(56) References Cited

U.S. PATENT DOCUMENTS

2020/0089629 A1* 3/2020 Wang .................. G06F 13/1626

* cited by examiner

*Primary Examiner* — Gary W. Cygiel
(74) *Attorney, Agent, or Firm* — Lowenstein Sandler LLP

(57) ABSTRACT

A first command directed to a first package of a plurality of memory packages, wherein the first command is issued to a command processor to be applied to the first package is received. A total number of pending commands directed to the first package satisfies a first threshold criterion is determined. Responsive to determining that the total number of pending commands directed to the first package satisfies the first threshold criterion, whether a second command directed to a second package is requesting transmission is determined. Responsive to the second command directed to the second package is requesting transmission, whether the first command comprises a write command is determined. Responsive to determining that the first command comprises a write command, execute a command directed to the second package.

20 Claims, 5 Drawing Sheets

200 

Receive a first command directed to a first package of a plurality of memory packages, wherein the first command is issued to a command processor to be applied to the first package. 210

Determine whether a total number of pending commands directed to the first package satisfies a first threshold criterion. 220

Responsive to determining that the total number of pending commands directed to the first package satisfies the first threshold criterion, determining whether a second command directed to a second package is requesting transmission. 230

Responsive to the second command directed to the second package requesting transmission, determining whether the first command comprises a write command. 240

Responsive to determining that the first command comprises a write command, switching to execute a command directed to the second package. 250

MANAGING PACKAGE SWITCHING BASED ON SWITCHING PARAMETERS

TECHNICAL FIELD

Embodiments of the disclosure relate generally to memory sub-systems, and more specifically, relate to managing package switching based on switching parameters.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 is a flow diagram of an example method to manage package switching based on switching parameters in accordance with some embodiments of the present disclosure.

DETAILED DESCRIPTION

Figure 1:
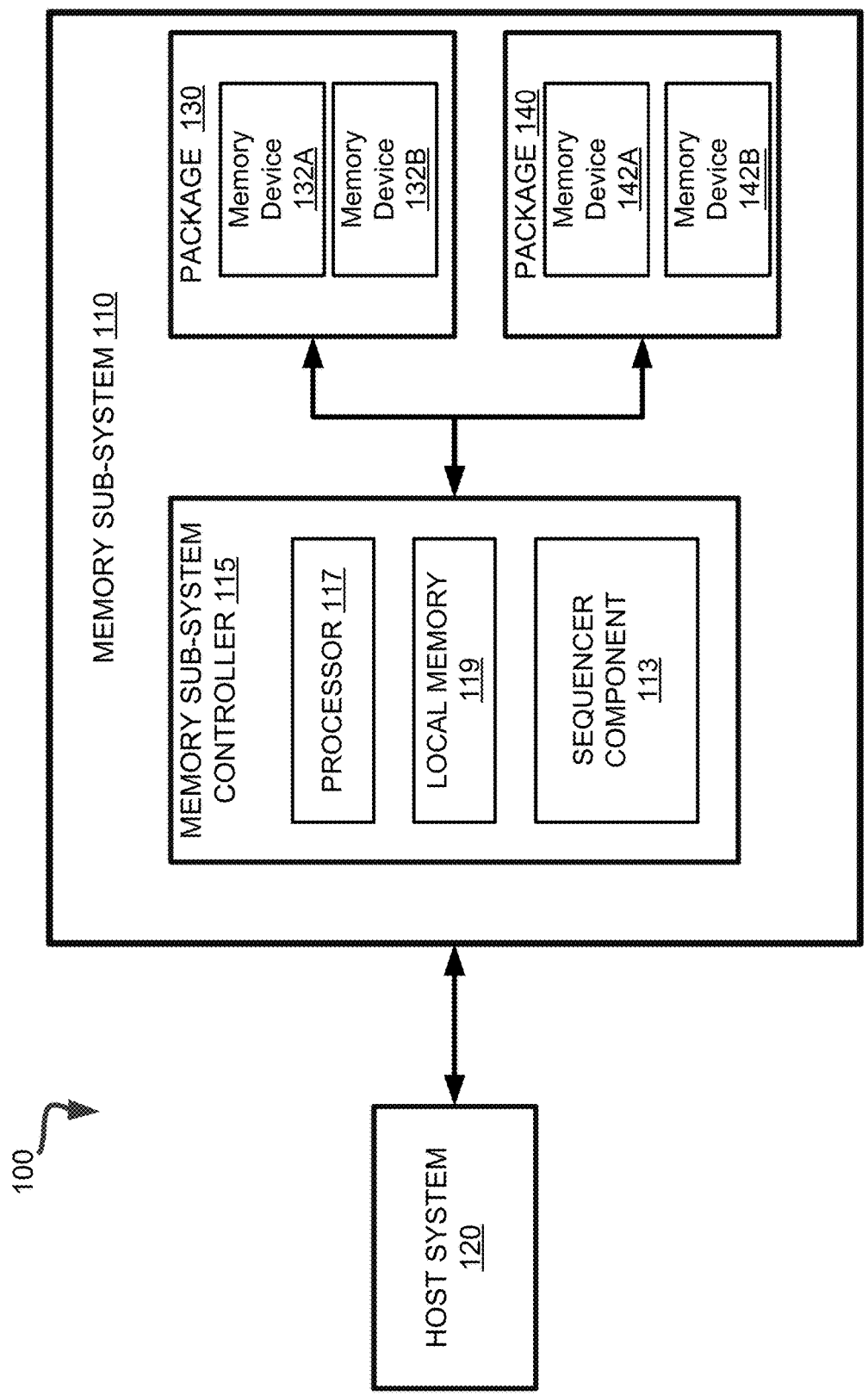
FIG. 1 illustrates an example computing system that includes a memory sub-system in accordance with some embodiments of the present disclosure.

Aspects of the present disclosure are directed to managing package switching based on switching parameters. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Other examples of non-volatile memory devices are described below in conjunction with FIG. 1. A non-volatile memory device is a package of one or more dies. Each die can consist of one or more partitions. Each partition consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

For example, a memory device can include a single die per package, two dies per package, four dies per package, etc. Each memory device can have one or more packages of dies (e.g., four packages consisting of one die each, two packages consisting of four dies each, two packages consisting of two dies and four dies, respectively, etc.). The memory sub-system can include a controller that performs various operations at particular memory device of the memory sub-system. For example, the controller can perform a read operation, write operation, or an erase operation at one or more of the memory devices. The controller can include multiple channels that are used to control different groups of memory devices. Each channel can correspond to a portion of the controller and interface components that are used to communicate with and perform operations at a respective group of memory devices. For example, a first channel can be used to perform operations at a first group of memory devices and a second channel can be used to perform operations at a second group of memory devices. As such, different channels of the controller can access different groups of memory devices of the memory sub-system.

In a conventional memory sub-system, a controller can include a sequencer component that is used to facilitate the performance of operations at the different groups of memory devices (e.g., packages) through the different channels. The sequencer component can receive an operation that is to be performed at the memory sub-system and can further receive data corresponding to the operation when the operation corresponds to a write operation. For example, the sequencer component can separate the operation (e.g., commands) into sub-operations (e.g., partition commands) that are to be performed at different memory devices of different packages through different channels. As such, the sequencer component can determine the partition command for various memory devices at the channels of the controller when a command is received by the memory sub-system.

The sequencer component of a conventional memory sub-system can determine the partition commands for a single command at a particular time. For example, a single command to be performed by the memory sub-system can be received and corresponding partition commands can be determined for each respective memory device that data is to be read or erased from or that data is to be written to. After the partition commands have been determined, the sequencer component can determine operations for particular memory devices. The controller can use the sequencer component to operate on memory devices in a synchronous manner. For example, the controller can use the resulting operations of the partition commands from the sequencer component to perform a particular type of operation or command (e.g., a read command, write command, or erase command) at a memory device in a first package at a particular time and cannot perform another type of operation at another memory device in a second package at the same time. Accordingly, conventional memory sub-system can switch between packages in a synchronous manner consistent with the determined operations for a particular memory device of a package in order to perform the particular type of command (e.g., a read command, write command, or erase command) at the memory device at a particular time.

These properties of the memory sub-system can provide latency delay (e.g., up to 30 ns) during switching between the memory devices of packages to perform the particular type of operation at memory device at a particular time (e.g., delays caused by switching the command and data bus to accommodate the particular operation at a desired memory device of the package). In conventional memory sub-system, latency can be increased based on a particular order of operations directed to different packages by switching between the packages to perform operations (e.g., write operations after switching from a package that executed a read operation) can result in significant delay.

For example, in a conventional memory sub-system, switching from a memory device of a first package after performing a read operations to a memory device of a second package to perform a read operation can result in an increase in latency from 10 clock cycles (e.g., ddr_clks) to 40 ddr_clks, switching from a memory device of a first package after performing a write operations to a memory device of a second package to perform a write operations can result in an increase in latency from 8 ddr_clks to 40 ddr_clks, and switching from a memory device of a first package after performing a write operations to a memory device of a second package to perform a read operation can result in an increase in latency from 10 ddr_clks to 32 ddr_clks.

Significant increase, however, can occur when switching from a memory device of a first package after performing a read operation to a memory device of a second package to perform a write operation which results in an increase in latency from 8 ddr_clks to 130 ddr_clks. Accordingly, conventional memory sub-system can suffer drops in data throughput (e.g., GiB/s) due to switching between packages under these circumstances.

Aspects of the present disclosure address the above and other deficiencies by having a memory sub-system that introduces switching parameters to optimize the sequencer component of the memory sub-system to avoid switching between packages under circumstances that can cause significant latency delays to maintain throughput of the memory sub-system (i.e., avoiding switching between packages when a read operation directed to a first package is executed and a write operation directed to a second package is ready to be executed).

Advantages of the present disclosure include, but are not limited to, avoiding significant latency delays caused by switching from a package that performed a read operation to another package to perform a write operation.

FIG. 1 illustrates an example computing system 100 that includes a memory sub-system 110 in accordance with some embodiments of the present disclosure. The memory sub-system 110 can include media, such as memory devices 132A, 132B, 142A, and 142B. The memory devices 132A, 132B, 142A, and 142B can be volatile memory devices, non-volatile memory devices, or a combination of such. In some embodiments, the memory devices 132A, 132B, 142A, and 142B can be included in separate respective packages 130 and 140. As depicted, memory devices 132A, 132B are included in package 130 and memory devices 142A, and 142B are included in package 140.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 132A, 132B, 142A, and 142B) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 132A, 132B, 142A, and 142B can include any combination of the different types of non-volatile memory devices and/or volatile memory devices. The volatile memory devices can be, but are not limited to, random access memory (RAM), such as dynamic random access memory (DRAM) and synchronous dynamic random access memory (SDRAM).

Some examples of non-volatile memory devices include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 132A, 132B, 142A, and 142B can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 132A, 132B, 142A, and 142B can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 132A, 132B, 142A, and 142B can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory devices 132A, 132B, 142A, and 142B can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 132A, 132B, 142A, and 142B to perform operations such as reading data, writing data, or erasing data at the memory devices 132A, 132B, 142A, and 142B and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to memory devices 132A, 132B, 142A, and 142B. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with memory devices 132A, 132B, 142A, and 142B. The memory sub-system controller 115 can further include host interface circuitry to communicate with the host system 120 via the physical host interface. The host interface circuitry can convert the commands received from the host system into command instructions to access the memory devices 132A, 132B, 142A, and 142B as well as convert responses associated with the memory devices 132A, 132B, 142A, and 142B into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access memory devices 132A, 132B, 142A, and 142B.

In some embodiments, the memory devices 132A, 132B, 142A, and 142B include local media controllers (not shown) that operate in conjunction with memory sub-system controller 115 to execute operations on one or more memory cells of the memory devices 132A, 132B, 142A, and 142B. An external controller (e.g., memory sub-system controller 115) can externally manage the memory devices 132A, 132B, 142A, and 142B (e.g., perform media management operations on the memory device 132A, 132B, 142A, or 142B). In some embodiments, memory sub-system 110 is a managed memory device, which is a raw memory devices 132A, 132B, 142A, and 142B having control logic (e.g., local media controller) on the die and a controller (e.g., memory sub-system controller 115) for media management within the same memory device package. An example of a managed memory device is a managed NAND (MNAND) device.

The memory sub-system 110 includes a sequencer component 113 that can avoid significant latency delays caused by switching from a memory device of a first package that executed a read operation to a memory device of a second package to ready to execute a write operation. In some embodiments, the memory sub-system controller 115 includes at least a portion of the sequencer component 113. In some embodiments, the sequencer component 113 is part of the host system 110, an application, or an operating system. In other embodiments, local media controller includes at least a portion of sequencer component 113 and is configured to perform the functionality described herein.

The sequencer component 113 can determine whether to switch from package 130 to the package 140 to execute commands directed to the package 140. To determine whether to switch to package 140, the sequencer component 113 determines whether a total number of pending commands directed to package 130 exceeds a package threshold. If the total number of pending commands directed to package 130 exceeds the package threshold the sequencer component 113 determines if there are any command directed to package 140 that are requesting transmission (i.e., a command that is ready to be issued to a command processor of the sequencer component 113 and applied to memory device 142A or memory device 142B of package 140). If there are no commands directed to package 140 requesting transmission, the sequencer component 113 continues to receive commands directed to package 130 until there is at least one command directed to package 140 requesting transmission.

In the event that a command directed to package 140 is requesting transmission, the sequencer component 113 determines whether the last command directed to package 130 was a write command. In response to determining that the last command directed to the package 130 was a write command, the sequencer component 113 performs a switch from package 130 to package 140 and continues to receive the remaining commands directed to package 140 prior to switching back to package 130. Accordingly, the sequencer component 113 avoids switching after executing a read command. In receiving the remaining commands directed to package 140, the sequencer component 113 issues each of the remaining commands to a command processor of the sequencer component 113 to be applied to memory device 142A or memory device 142B of package 140.

However, if the last command directed to the package 130 is a read command, the sequencer component 113 determines whether there is at least one read command directed to package 140 and performs a switch, in the event that there are any read command directed to package 140, from package 130 to package 140 and issues the read command to a command processor of the sequencer component 113 to be applied to memory device 142A or memory device 142B. Accordingly, the sequencer component 113 avoids switching to a write command directed to a memory device of the second package. In the event there are no read command directed to package 140, the sequencer component 113 performs a switch from package 130 to package 140 and issues the write command to a command processor of the sequencer component 113 to be applied to memory device 132A or memory device 132B. Accordingly, the sequencer component 113 has no other option but to switch to package 140 under the assumption that there are no other command other than a write command directed to the package is available. Further details with regards to the operations of the sequencer component 113 are described below.

FIG. 2 is a flow diagram of an example method 200 to determine when to switch to another package of a plurality of packages, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the sequencer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic receives a first command directed to a first package of a plurality of memory packages, wherein the first command is issued to a command processor to be applied to the first package. The first command refers to a command received from the host system directed to a memory device of a package. The command comprises an operation to be performed by the memory sub-system for a memory device from which data is to be read or erased or to which data is to be written.

At operation 220, the processing logic determines whether a total number of pending commands directed to the first package satisfies a first threshold criterion. To determine whether the total number of pending commands directed to the first package satisfies the first threshold criterion, the processing logic determines whether the total number of pending commands directed to the first package exceeds a first threshold. The first threshold refers to the larger of (i) a minimum number of commands to be directed to the first package or (ii) a product of a number of remaining commands directed to the first package and a first package transaction ratio (e.g., a value between 0 and 1). The first package transaction ratio is configurable based on the number of pending commands directed to the first package (i.e., the more pending commands directed to the first package the closer the first package transaction ratio is to a value of 1).

At operation 230, responsive to determining that the total number of pending commands directed to the first package satisfies the first threshold criterion, the processing logic determines whether a second command directed to a second package is requesting transmission. As described previously, a command requesting transmission refers to a command that is ready to be issued to a command processor of the sequencer component and applied to memory devices of the package.

At operation 240, responsive to the second command directed to the second package requesting transmission, the processing logic determines whether the first command comprises a write command.

At operation 250, responsive to determining that the first command comprises a write command, the processing logic switches to a second package to execute a command directed to the second package. Switching to the second package to execute a command directed to the second package refers to the sequencer component solely receiving commands directed to the second package and not the first package. Depending on the embodiment, responsive to switching to the second package to execute the second command directed to the second package, the processing logic receives the remaining commands directed to the second package to issue to the command processor and subsequently applied to a memory device of the second package.

Depending on the embodiment, responsive to determining that the first command comprising a read command, the processing logic determines whether the second command comprising a read command directed to the second package is requesting transmission. Responsive to determining that the second command comprises a read command directed to the second package is requesting transmission, the processing logic switches to the second package to execute the second command directed to the second package, wherein the second command is issued to the command processor to be applied to the second package. As described previously, switching to the second package to execute the second command directed to the second package refers to the sequencer component solely receiving the second command directed to the second package and no command directed to the first package. Responsive to determining that the second command comprises a write command directed to the second package is requesting transmission, the processing logic switches to the second package to execute the second command directed to the second package, wherein the second command is issued to a command processor to be applied to the second package. As described previously, switching to the second package to execute the second command directed to the second package refers to the sequencer component solely receiving the second command directed to the second package and no command directed to the first package.

Figure 3:
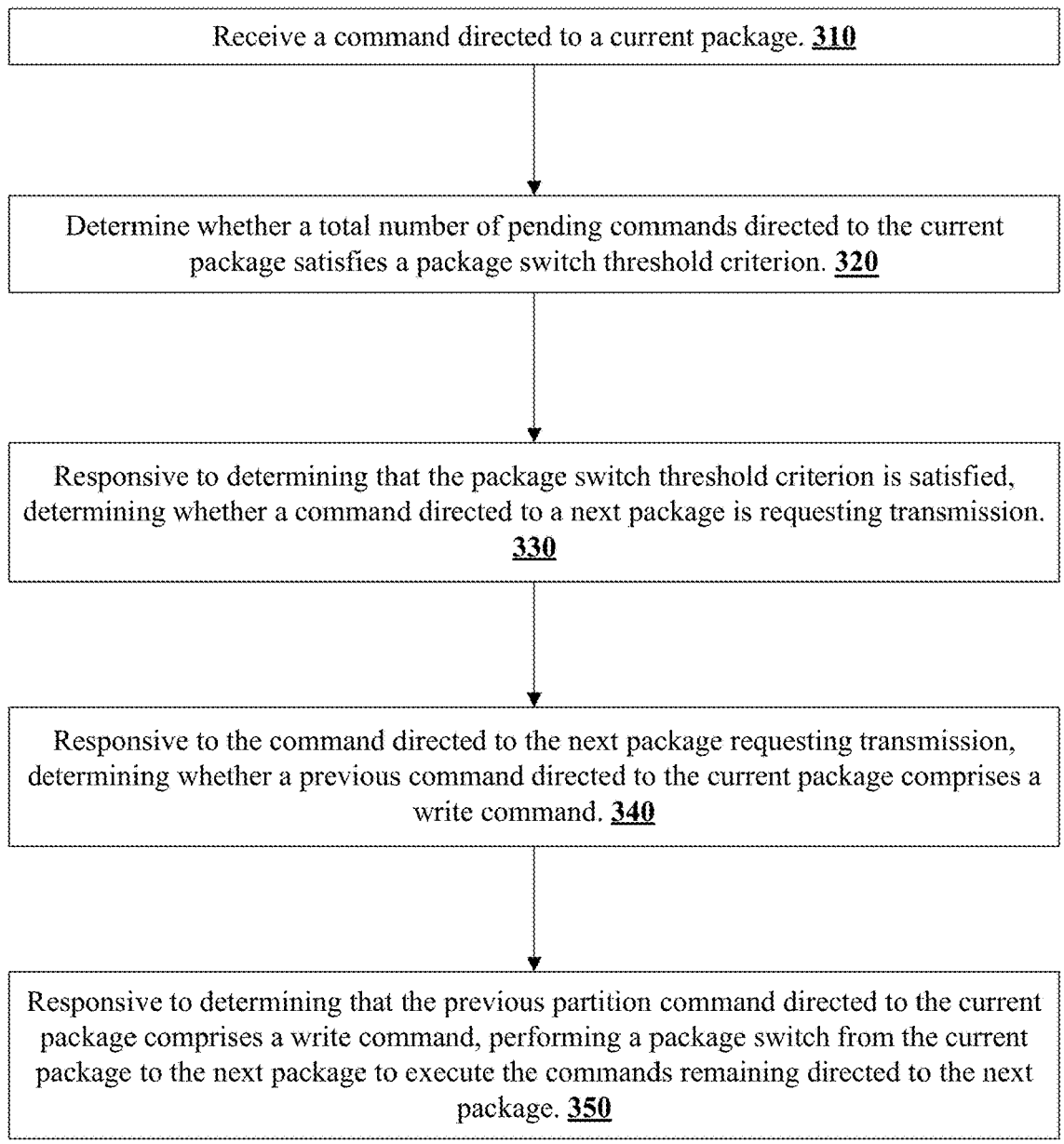
FIG. 3 is a flow diagram of an example method to manage package switching based on switching parameters in accordance with some embodiments of the present disclosure.

FIG. 3 is a flow diagram of an example method 300 to determine when to switch to another package of a plurality of packages, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the sequencer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic receives a command directed to a current package. As described previously, the command is received from the host system and directed to a memory device of a package. The command comprises an operation to be performed by the memory sub-system for a memory device form from which data is to be read or erased or to which data is to be written.

At operation 320, the processing logic determines whether a total number of pending commands directed to the current package satisfies a package switch threshold criterion. To determine whether a total number of pending commands directed to the current package satisfies a package switch threshold criterion, the processing logic determines whether the total number of pending commands directed to the current package exceeds a larger of (i) a minimum number of commands to be directed to the current package or (ii) a product of a number of remaining commands directed to the current package and a current package transaction ratio. As described previously, the current package transaction ratio is configurable based on the number of pending commands directed to the current package (i.e., the more pending commands directed to the current package the closer the current package transaction ratio is to a value of 1).

At operation 330, the processing logic responsive to determining that the package switch threshold criterion is satisfied, determines whether a command directed to a next package is requesting transmission. As described previously, a command requesting transmission refers to a command that is ready to be issued to a command processor of the sequencer component and applied to memory devices of the package. The sequencer component indicates when a command is ready to be issued to a command processor of the sequencer component At operation 340, the processing logic responsive to the command directed to the next package requesting transmission, determines whether a previous command directed to the current package comprises a write command. As described previously, a command requesting transmission refers to a command that is ready to be issued to a command processor of the sequencer component 113 and applied to memory devices of the next package).

At operation 350, responsive to determining that the previous command directed to the current package comprises a write command, the processing logic performs a package switch from the current package to the next package to execute the remaining commands directed to the next package. As described previously, package switching from current package to the next package refers to the sequencer component solely receiving commands directed to the next package rather than commands directed to the current package. Response to performing a package switch from the current package to the next package, the processing logic changes the designation of the next package to the current package.

Depending on the embodiment, responsive to determining that the previous command directed to the current package comprises a read command, the processing logic determines whether there is at least one command that comprises a read command directed to the next package that is requesting transmission. As described previously, a command requesting transmission refers to a command that is ready to be issued to a command processor of the sequencer component 113 and applied to memory devices of the package. Responsive to determining that there is at least one command that comprises a read command directed to the next package requesting transmission, the processing logic switches from the current package to the next package to execute the at least one command directed to the next package comprising a read command directed to the next package. Responsive to determining that there are no commands that comprising a read command directed to the next package requesting transmission, the processing logic switches from the current package to the next package to execute the command comprising a write command directed to the next package. As described previously, package switching from current package to the next package refers to the sequencer component solely receiving commands directed to the next package rather than commands directed to the current package.

Figure 4:
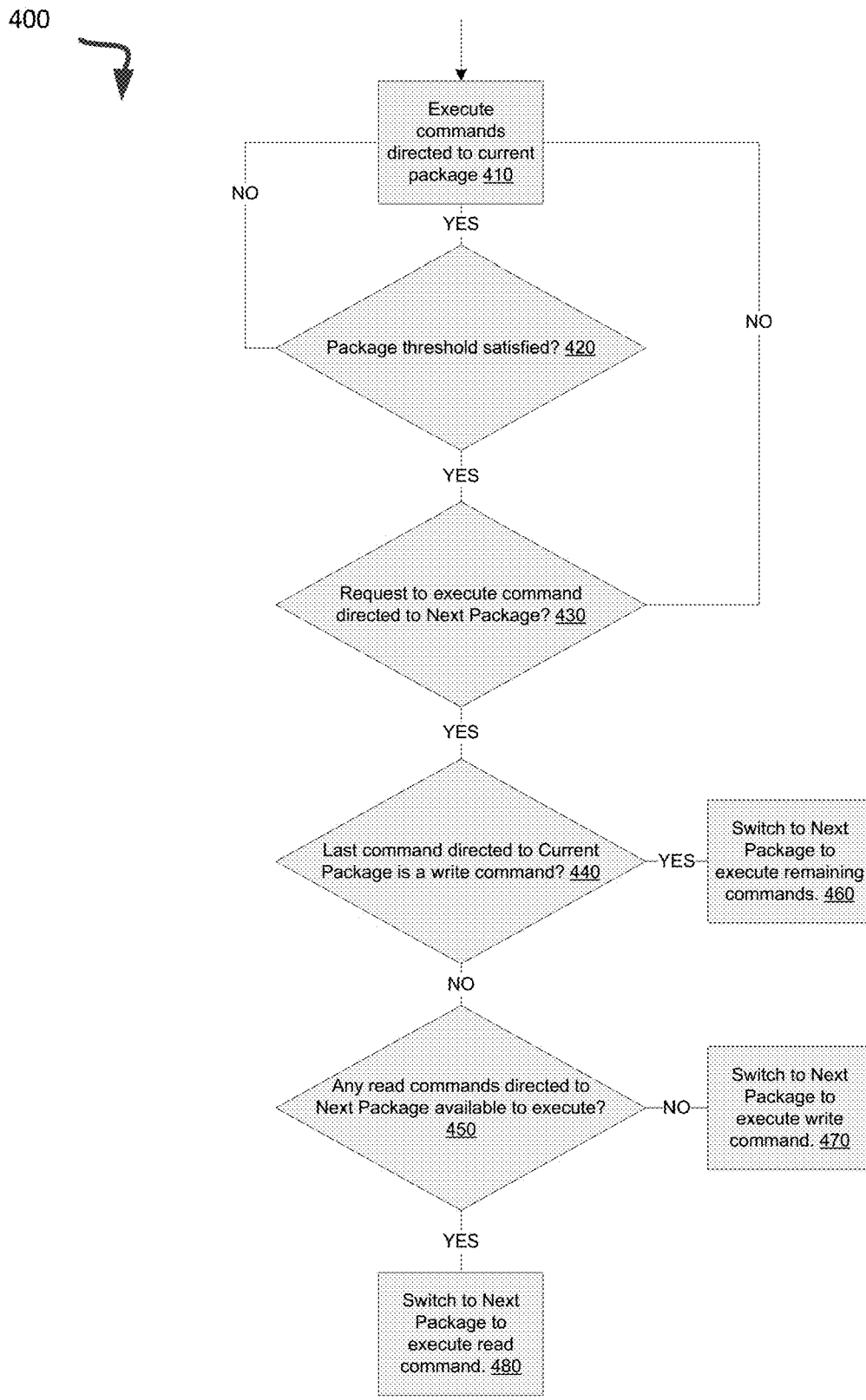
FIG. 4 is a flow diagram of an example method to manage package switching based on switching parameters in accordance with some embodiments of the present disclosure.

FIG. 4 is a flow diagram of an example method 400 to determine when to switch to another package of a plurality of packages, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the sequencer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic executes commands directed to current package. At operation 420, the processing logic determines whether a package threshold is satisfied. As described previously, the package threshold is satisfied if the total number of pending commands directed to the first package exceeds the larger of (i) a minimum number of commands to be directed to the current package or (ii) a product of a number of remaining commands directed to the current package and a current package transaction ratio (e.g., a value between 0 and 1). The current package transaction ratio is configurable based on the number of pending commands directed to the current package.

At operation 430, the processing logic determines whether a request to execute the command directed to the next package is received. As described previously, a request to execute the command directed to the next package refers to a command that is ready to be issued to a command processor of the sequencer component and applied to memory devices of the next package.

At operation 440, the processing logic determines whether the last command directed to current package is a write command. Responsive to determining that the last command directed to the current package is a write command, at operation 460, the processing logic performs a switch to the next package to execute remaining commands directed to the next package.

At operation 450, the processing logic determines whether any read commands directed to next package is available to execute. Responsive to determining that at least one read command directed to the next package is available to execute, at operation 480, the processing logic performs a switch to the next package to execute a read command directed to the next package. Otherwise, at operation 470, the processing logic performs a switch to the next package to execute a write command directed to the next package.

Figure 5:
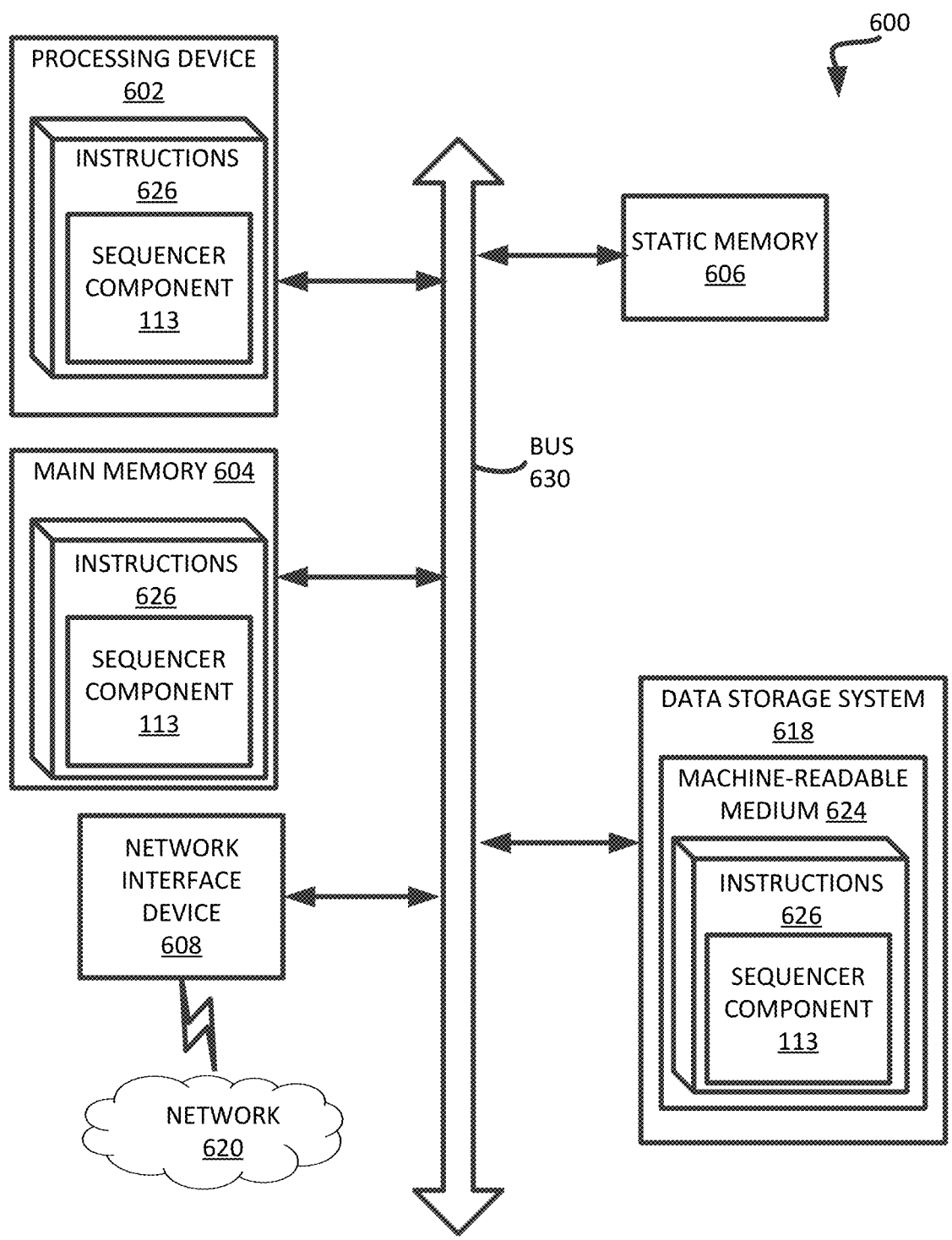
FIG. 5 is a block diagram of an example computer system in which embodiments of the present disclosure may operate.

FIG. 5 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the sequencer component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a sequencer component (e.g., the sequencer component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a plurality of memory packages, each memory package comprising a plurality of dies; and
   a sequencer component, operatively coupled to the plurality of memory packages, the sequencer component to perform operations comprising:
      receiving a first command directed to a first package of the plurality of memory packages, wherein the first command is issued to a command processor to be applied to the first package;
      determining whether a total number of pending commands directed to the first package satisfies a first threshold criterion;
      responsive to determining that the total number of pending commands directed to the first package satisfies the first threshold criterion, determining whether a second command directed to a second package is requesting transmission;
      responsive to the second command directed to the second package requesting transmission, determining whether the first command comprises a write command; and
      responsive to determining that the first command comprises a write command, switching to execute a command directed to the second package.

2. The system of claim 1, wherein determining that the total number of pending commands directed to the first package satisfies the first threshold criterion comprises determining that the total number of pending commands directed to the first package exceeds a first threshold.

3. The system of claim 2, wherein the first threshold comprises a larger of (i) a minimum number of commands to be directed to the first package or (ii) a product of a number of remaining commands directed to the first package and a first package transaction ratio.

4. The system of claim 1, wherein the sequencer component is to perform further operations comprising:
   responsive to determining that the first command does not comprise a write command, determining whether the second command comprises a read command directed to the second package.

5. The system of claim 4, wherein determining that the second command comprises a read command directed to the second package comprises switching to execute the second command directed to the second package, wherein the second command is issued to the command processor to be applied to the second package.

6. The system of claim 4, wherein determining that the second command comprises a write command directed to the second package comprises switching to execute the second command directed to the second package, wherein the second command is issued to a command processor to be applied to the second package.

7. The system of claim 1, wherein switching to execute the second command directed to the second package comprises receiving the remaining commands directed to the second package to issue to the command processor to be applied to the second package.

8. A method comprising:
   receiving a first command directed to a first package of a plurality of memory packages, wherein the first command is issued to a command processor to be applied to the first package;

determining whether a total number of pending commands directed to the first package satisfies a first threshold criterion;

responsive to determining that the total number of pending commands directed to the first package satisfies the first threshold criterion, determining whether a second command directed to a second package is requesting transmission;

responsive to the second command directed to the second package requesting transmission, determining whether the first command comprises a write command; and responsive to determining that the first command comprises a write command, switching to execute a command directed to the second package.

9. The method of claim 8, wherein determining that the total number of pending commands directed to the first package satisfies the first threshold criterion comprises determining that the total number of pending commands directed to the first package exceeds a first threshold.

10. The method of claim 9, wherein the first threshold comprises a larger of (i) a minimum number of commands to be directed to the first package or (ii) a product of a number of remaining commands to be directed to the first package and a first package transaction ratio.

11. The method of claim 8, further comprising:

responsive to determining that the first command comprises a read command, determining whether the second command comprises a read command directed to the second package.

12. The method of claim 11, wherein determining that the second command comprises a read command directed to the second package comprises switching to execute the second command directed to the second package, wherein the second command is issued to the command processor to be applied to the second package.

13. The method of claim 11, wherein determining that the second command comprises a write command directed to the second package comprises switching to execute the second command directed to the second package, wherein the second command is issued to a command processor to be applied to the second package.

14. The method of claim 8, wherein switching to execute the second command directed to the second package comprises receiving the remaining commands directed to the second package to issue to the command processor to be applied to the second package.

15. A non-transitory computer-readable storage medium comprising instruction that, when executed by a processing device, cause the processing device to perform operations comprising:

receiving a command directed to a current package;

determining whether a total number of pending commands directed to the current package satisfies a package switch threshold criterion;

responsive to determining that the package switch threshold criterion is satisfied, determining whether a command directed to a next package is requesting transmission;

responsive to the command directed to the next package requesting transmission, determining whether a previous command directed to the current package comprises a write command; and responsive to determining that the previous command directed to the current package comprises a write command, performing a package switch from the current package to the next package to execute the commands remaining directed to the next package.

16. The non-transitory computer-readable storage medium of claim 15, wherein performing a package switch from the current package to the next package comprises changing a designation of the next package to the current package.

17. The non-transitory computer-readable storage medium of claim 15, wherein determining that the total number of pending commands directed to the current package exceeds a larger of (i) a minimum number of commands to be directed to the current package or (ii) a product of a number of remaining commands directed to the current package and a current package transaction ratio.

18. The non-transitory computer-readable storage medium of claim 15, wherein causing the processing device to further perform operations comprising:

responsive to determining that the previous command directed to the current package comprises a read command, determining whether there is at least one command that comprises a read command directed to the next package that is requesting transmission.

19. The non-transitory computer-readable storage medium of claim 18, wherein responsive to determining that there is at least one command that comprises a read command directed to the next package that is requesting transmission, switching to execute the at least one command directed to the next package that comprises a read command directed to the next package.

20. The non-transitory computer-readable storage medium of claim 18, wherein responsive to determining that there is at least one command that comprises a write command directed to the next package that is requesting transmission, switching to execute the at least one command that comprises a write command directed to the next package.

* * * * *